(12) United States Patent
Shibata et al.

(10) Patent No.: US 8,652,657 B2
(45) Date of Patent: Feb. 18, 2014

(54) ORGANIC EL DEVICE AND METHOD FOR MANUFACTURING THE SAME

(75) Inventors: Masaomi Shibata, Osaka (JP); Kenji Okumoto, Kyoto (JP); Kouhei Koresawa, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/463,128

(22) Filed: May 3, 2012

(65) Prior Publication Data

US 2013/0009134 A1 Jan. 10, 2013

Related U.S. Application Data

(63) Continuation of application No. PCT/JP2011/003846, filed on Jul. 5, 2011.

(51) Int. Cl.
*H01L 51/54* (2006.01)
*H01L 51/56* (2006.01)

(52) U.S. Cl.
USPC ............... 428/690; 428/917; 438/46; 427/66; 313/504; 313/506; 257/40

(58) Field of Classification Search
None
See application file for complete search history.

(56) References Cited

U.S. PATENT DOCUMENTS

| | | | |
|---|---|---|---|
| 5,443,922 A | 8/1995 | Nishizaki et al. | |
| 7,592,980 B2 | 9/2009 | Yamazaki et al. | |
| 8,188,945 B2 | 5/2012 | Yamazaki et al. | |
| 8,203,264 B2 | 6/2012 | Kang et al. | |
| 2007/0116981 A1* | 5/2007 | Isobe ............................ | 428/690 |
| 2007/0132365 A1 | 6/2007 | Kang et al. | |
| 2007/0176176 A1 | 8/2007 | Yamazaki et al. | |
| 2007/0181887 A1* | 8/2007 | Kijima et al. .................... | 257/79 |
| 2008/0157657 A1* | 7/2008 | Matsunami et al. .......... | 313/504 |
| 2008/0164809 A1* | 7/2008 | Matsunami et al. .......... | 313/504 |
| 2009/0066237 A1* | 3/2009 | Kambe et al. ................. | 313/504 |
| 2009/0283775 A1 | 11/2009 | Yamazaki et al. | |
| 2010/0253214 A1 | 10/2010 | Imai et al. | |
| 2011/0309368 A1 | 12/2011 | Yamazaki et al. | |

FOREIGN PATENT DOCUMENTS

| | | |
|---|---|---|
| JP | 05-163488 | 6/1993 |
| JP | 2003-202818 | 7/2003 |
| JP | 2004-126513 | 4/2004 |
| JP | 2007-164183 | 6/2007 |
| JP | 2010-244868 | 10/2010 |

OTHER PUBLICATIONS

International Search Report in PCT/JP2011/003846, dated Jul. 5, 2011.

* cited by examiner

*Primary Examiner* — Dawn L. Garrett
(74) *Attorney, Agent, or Firm* — Greenblum & Bernstein, P.L.C.

(57) ABSTRACT

Provided is an organic EL device comprising: an organic EL element including an anode 114, an organic EL layer 116, and a cathode 117; a wiring layer 106 that supplies power to the anode 114; and an organic layer 111 interposed between the anode 114 and the wiring layer 106, wherein the organic layer 111 includes (i) a first organic layer 112 including an azatriphenylene derivative and (ii) a second organic layer 113 including an amine-based compound, the first organic layer 112 being layered on the wiring layer 106, and the second organic layer 113 being layered on the first organic layer 112.

11 Claims, 8 Drawing Sheets

ORGANIC EL DEVICE AND METHOD FOR MANUFACTURING THE SAME

This is a continuation of International Application PCT/JP2011/003846, with an international filing date of Jul. 5, 2011.

TECHNICAL FIELD

The present invention relates to a structure of a contact portion where a source-drain electrode (hereinafter "SD electrode") of an organic EL device makes contact with an anode.

BACKGROUND ART

In recent years, progress has been made in the research and development of organic EL devices, which are light-emitting elements that rely on the phenomenon of electroluminescence of organic material. The organic EL devices have a structure where an organic light-emitting layer is interposed between an anode and a cathode. The following describes a general structure of such an organic EL device. FIG. 8 is a partial cross-sectional view that schematically shows a structure of an organic EL device 10. As shown in FIG. 8, a gate electrode 12 is disposed on a substrate 11, and a gate insulating film 13 covers the gate electrode 12. A semiconductor layer 14 is disposed on a portion of the gate insulating film 13, which is located above the gate electrode 12. Also, a wiring layer for supplying power to an anode, which is described below, is formed on the gate insulating film 13. Specifically, SD electrodes 15 and 16 are formed on the gate insulating film 13, such that parts of the respective SD electrodes 15 and 16 are formed on the semiconductor layer 14 with a gap therebetween. Note that the SD electrodes 15 and 16 are made of molybdenum (Mo), for example. Hereinafter, a description is provided with the assumption that the SD electrodes 15 and 16 are made of Mo.

An interlayer insulating film 17 is formed to cover the SD electrodes 15 and 16. The interlayer insulating film 17 has, for example, a two-layer structure including a passivation film 18 and a planarizing film 19. The interlayer insulating film 17 has a contact hole 17ch formed therein, and an anode 21 is formed along the contact hole 17ch. In other words, a part of the anode 21 enters the contact hole 17ch so as to make contact with the SD electrode 16 in the contact hole 17ch. The anode 21 is made of aluminum (Al), for example. Hereinafter, a description is provided with the assumption that the anode 21 is made of Al.

A bank 22 is layered on a portion of the anode 21, which corresponds to an edge 21a of the anode 21 and the contact hole 17ch. An organic light-emitting layer 23 is layered on a portion of the anode 21, which is defined by the bank 22. A cathode 24 is formed on the organic light-emitting layer 23 and the bank 22, and a sealing film 25 is formed on the cathode 24.

Note that Patent literature 1 is known as prior art literature pertaining to a structure of an organic EL device.

CITATION LIST

Patent Literature

[Patent Literature 1]
Japanese Patent Application Publication No. 2010-244868

SUMMARY OF INVENTION

Technical Problem

Regarding the organic EL device 10, although a part of the anode 21 enters the contact hole 17ch, the SD electrode 16 does not, in practice, make direct contact with the anode 21. As shown in the enlarged part of FIG. 8, (i) a metal oxide layer (molybdenum oxide (MoOx) layer) 16a derived from the material of the SD electrode 16 and (ii) a metal oxide layer (aluminum oxide layer) 21a derived from the material of the anode 21 are formed between the SD electrode 16 and the anode 21.

The following briefly describes the reason why these metal oxide layers are formed. The interlayer insulating film 17 is formed through a baking process. During the baking process, the SD electrode 16 is partially exposed in the atmosphere. This causes a surface of the SD electrode 16 to oxidize to form the metal oxide layer 16a, resulting in the anode 21 being formed on the metal oxide layer 16a. In short, the metal oxide layer 16a and the anode 21 are in direct contact with each other. Since Al, which is the material of the anode 21, has a higher ionization tendency than Mo, which is the material of the SD electrode 16, the Al partially oxidizes by taking in the oxygen of the MoOx in the vicinity of the interface between the Al and the MoOx. This results in aluminum oxide being formed. In addition, since the anode 21 is formed by use of a sputtering method or the like, oxidation is further accelerated by the impact during the formation of the anode 21.

For the aforementioned reason, the metal oxide (MoOx) layer 16a and the metal oxide (aluminum oxide) layer 21a are formed. Since aluminum oxide is an insulator, contact resistance is increased when the metal oxide (aluminum oxide) layer 21a is formed. This poses a problem of a decrease in conductivity when a forward bias is applied.

On the other hand, when a reverse bias is applied, it is preferable that the organic EL device is capable of reducing leak current. This is for the purpose of suppressing light emission of the organic light-emitting layer when the reverse bias is applied.

The above provides the description with an example where the SD electrode 16 is made of Mo and the anode 21 is made of Al. However, the same problem arises when the SD electrode 16 is made of any of tungsten, molybdenum-tungsten, vanadium, and ruthenium and the anode 21 is made of any of silver, chromium, nickel, and an alloy of any of silver, chromium, and nickel.

The present invention has been achieved in view of the above problem, and an aim thereof is to provide an organic EL device capable of increasing a supply current to an anode when a forward bias is applied, and of reducing a leak current when a reverse bias is applied.

Solution to Problem

In order to solve the above problem, one aspect of the present invention is an organic EL device comprising: an organic EL element including an anode, an organic EL layer, and a cathode; a wiring layer that supplies power to the anode; and an organic layer interposed between the anode and the wiring layer, wherein the organic layer includes (i) a first organic layer including an azatriphenylene derivative and (ii) a second organic layer including an amine-based compound, the first organic layer being layered on the wiring layer, and the second organic layer being layered on the first organic layer.

Advantageous Effects of Invention

In the organic EL device according to the one aspect of the present invention, the organic layer is interposed between the anode and the wiring layer. In other words, the anode and the wiring layer are not directly in contact with each other. Also, the organic layer has oxidation resistance (barrier properties against oxygen). Accordingly, even when a surface of the wiring layer oxidizes to form a metal oxide layer, oxidation of the anode is prevented since the metal oxide layer does not make direct contact with the anode, and the organic layer having oxidation resistance is interposed between the wiring layer and the anode.

Also, the organic layer is formed by layering the first organic layer including an azatriphenylene derivative and the second organic layer including an amine-based compound. The first organic layer and the second organic layer are considered to function as charge generation layers. In other words, charge is generated at the interface between the first organic layer and the second organic layer. This increases the amount of current supplied to the anode when a forward bias is applied, resulting in improvement of conductivity.

In addition, a portion at which the wiring layer electrically makes contact with the anode via the organic layer has diode characteristics, which makes it possible to suppress a leak current when a reverse bias is applied.

DESCRIPTION OF EMBODIMENTS

Embodiment

Figure 1:
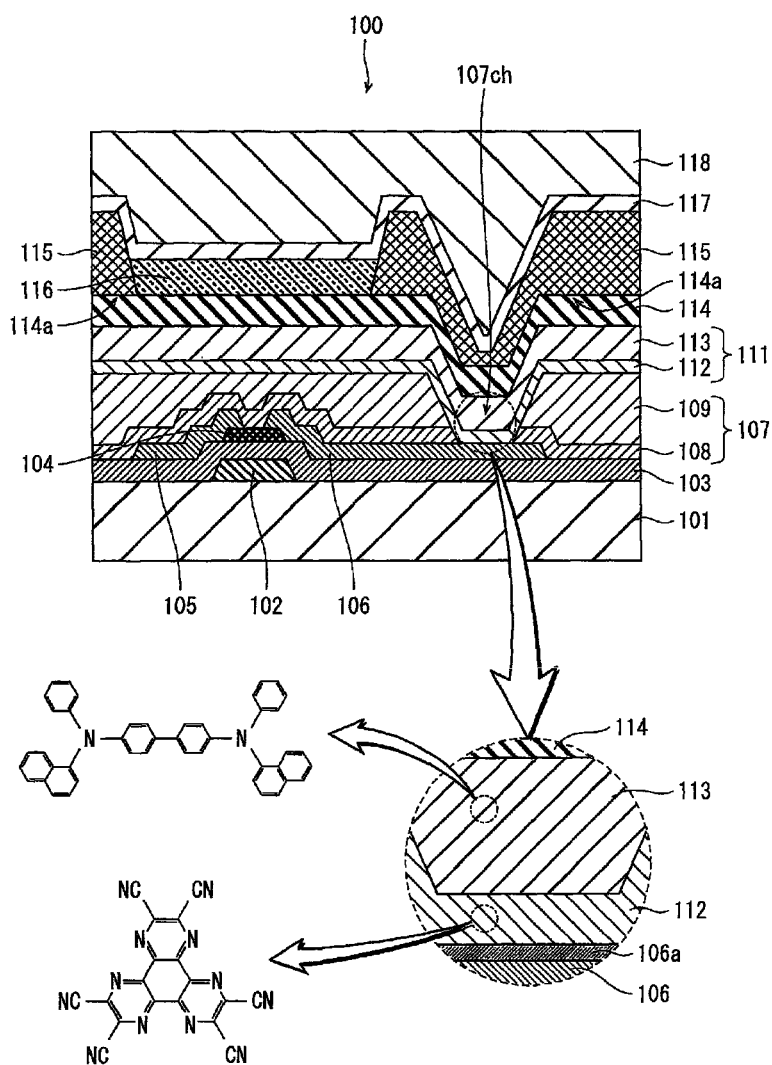
FIG. 1 is a partial cross-sectional view that schematically shows a main part of an organic EL device 100.

A first aspect of the present invention is an organic EL device comprising: an organic EL element including an anode, an organic EL layer, and a cathode; a wiring layer that supplies power to the anode; and an organic layer interposed between the anode and the wiring layer, wherein the organic layer includes (i) a first organic layer including an azatriphenylene derivative and (ii) a second organic layer including an amine-based compound, the first organic layer being layered on the wiring layer, and the second organic layer being layered on the first organic layer.

In the organic EL device according to the first aspect of the present invention, the organic layer is interposed between the anode and the wiring layer. In other words, the anode and the wiring layer are not directly in contact with each other. Also, the organic layer has oxidation resistance. Accordingly, even when a surface of the wiring layer oxidizes to form a metal oxide layer, oxidation of the anode is prevented since the metal oxide layer does not make direct contact with the anode, and the organic layer having oxidation resistance is interposed between the wiring layer and the anode.

Also, the organic layer is formed by layering the first organic layer including an azatriphenylene derivative and the second organic layer including an amine-based compound. The first organic layer and the second organic layer are considered to function as charge generation layers. In other words, charge is generated at the interface between the first organic layer and the second organic layer. This increases the amount of current supplied to the anode when a forward bias is applied, resulting in improvement of conductivity.

In addition, the portion at which the wiring layer electrically makes contact with the anode via the organic layer has diode characteristics, which makes it possible to suppress a leak current when a reverse bias is applied.

According to a second aspect of the present invention, the azatriphenylene derivative may be a compound represented by the following general formula.

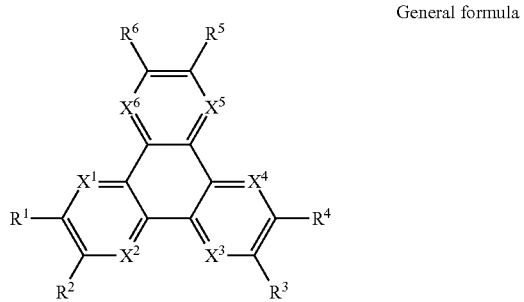

General formula

In the general formula shown above, R1 to R6 are each independently a substituent selected from hydrogen, halogen, a hydroxyl group, an amino group, an arylamino group, a substituted or unsubstituted carbonyl group having 20 or less carbon atoms, a substituted or unsubstituted carbonyl ester group having 20 or less carbon atoms, a substituted or unsubstituted alkyl group having 20 or less carbon atoms, a substituted or unsubstituted alkenyl group having 20 or less carbon atoms, a substituted or unsubstituted alkoxyl group having 20 or less carbon atoms, a substituted or unsubstituted aryl group having 30 or less carbon atoms, a substituted or unsubstituted heterocyclic group having 30 or less carbon atoms, a nitrile group, a cyano group, a nitro group, and a silyl group. Any adjacent substituents from among R1 to R6 are connectable to form a ring. X1 to X6 are each independently a carbon atom or a nitrogen (N) atom.

According to a third aspect of the present invention, the amine-based compound may be at least one selected from the group consisting of N,N'-diphenyl-N,N'-bis(1-naphthyl)benzidine (NPB), a triphenylamine derivative (TPD, β-NPD, MeO-TPD, TAPC), a phenylamine tetramer (TPTE), a starburst-triphenylamine derivative (m-MTDADA, NATA, 1-TNATA, 2-TNATA), a spiro-triphenylamine derivative (Spiro-TPD, Spiro-NPD, Spiro-TAD), rubrene, pentacene, copper phthalocyanine (CuPc), titanium oxide phthalocyanine (TiOPc), and α-sexithiophene (α-6T).

According to a fourth aspect of the present invention, a surface of a part of the wiring layer, which is in contact with the organic layer, may be oxidized, and the oxidized surface may be made of at least one selected from the group consisting of molybdenum oxide, tungsten oxide, molybdenum-tungsten oxide, vanadium oxide, and ruthenium oxide.

According to a fifth aspect of the present invention, the anode may be made of at least one selected from the group consisting of aluminum, silver, chromium, nickel, and an alloy of any of aluminum, silver, chromium, and nickel.

According to a sixth aspect of the present invention, the wiring layer may be one of a source electrode and a drain electrode of a thin-film transistor.

According to a seventh aspect of the present invention is a manufacturing method of an organic EL device comprising the steps of: forming a wiring layer from metal; forming an insulating material layer on the wiring layer; exposing a part of the wiring layer to an atmosphere including oxygen by removing a part of the insulating material layer; forming a first organic layer on the part of the wiring layer by a vapor deposition method, the first organic layer including an azatriphenylene derivative; forming a second organic layer on the first organic layer by the vapor deposition method, the second organic layer including an amine-based compound; and forming an organic EL element by sequentially forming, on the second organic layer, an anode, an organic EL layer, and a cathode.

According to an eighth aspect of the present invention, a metal surface of the part of the wiring layer may be oxidized in the exposing step.

According to a ninth aspect of the present invention, the exposing step may at least include: a substep of forming a contact hole in the insulating material layer so as to expose the part of the wiring layer; and a substep of forming an insulating layer by heating the insulating material layer in a state where the part of the wiring layer is exposed.

Embodiment 1

—Cross-Sectional View of Organic EL Device—

FIG. 1 is a partial cross-sectional view that schematically shows a main part of an organic EL device 100 of the present embodiment. As shown in FIG. 1, a gate electrode 102 is disposed on a substrate 101, and a gate insulating film 103 covers the gate electrode 102. A semiconductor layer 104 is disposed on a portion of the gate insulating film 103, which is located above the gate electrode 102. Also, a wiring layer for supplying power to an anode, which is described below, is formed on the gate insulating film 103. Specifically, SD electrodes 105 and 106 are formed on the gate insulating film 103, such that parts of the respective SD electrodes 105 and 106 are formed on the semiconductor layer 104 with a gap therebetween.

An interlayer insulating film 107 is formed to cover the SD electrodes 105 and 106. The interlayer insulating film 107 has, for example, a two-layer structure including a passivation film 108 and a planarizing film 109. The interlayer insulating film 107 has a contact hole 107ch formed therein. An organic layer 111 and an anode 114 are layered along the contact hole 107ch in the stated order. In other words, the SD electrode 106 and the anode 114 are electrically in contact with each other via the organic layer 111.

A bank 115 is layered on a portion of the anode 114, which corresponds to an edge 114a of the anode 114 and the contact hole 107ch. An organic light-emitting layer 116 as an organic EL layer is layered on a portion of the anode 21, which is defined by the bank 115. A cathode 117 is formed on the organic light-emitting layer 116 and the bank 115, and a sealing film 118 is formed on the cathode 117.

In the present embodiment, an example is given where the organic EL layer is composed of a single layer, i.e., the organic light-emitting layer 116. However, the organic EL layer may be composed of a plurality of layers including the organic light-emitting layer 116. Specifically, a hole injection layer, a hole transport layer, or a hole injection/transport layer may be interposed between the anode 114 and the organic light-emitting layer 116 as necessary. Similarly, an electron injection layer, an electron transport layer, or an electron injection/transport layer may be interposed between the cathode 117 and the organic light-emitting layer 116 as necessary. Also, layers from the anode 114 to the cathode 117 are collectively referred to as an organic EL element.

—Material of Each Layer in Organic EL Device—

The following describes in detail a material of each layer in the organic EL device 100.

—Substrate 101—

The substrate 101 is formed from an insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, alumina, or the like. Alternatively, the substrate 101 may be an organic resin film.

—Gate Electrode 102—

The gate electrode 102 is formed from a commonly-known electrode material. Examples of such commonly-known electrode material include: an alloy of silver, palladium, and copper; an alloy of silver, rubidium, and gold; an alloy of molybdenum and chromium (MoCr); an alloy of nickel and chromium (NiCr); aluminum (Al); aluminum alloy; indium tin oxide (ITO); indium zinc oxide (IZO); copper (Cu); and molybdenum (Mo).

—Gate Insulating Film 103—

The gate insulating film 103 is formed from a commonly-known gate insulating material (e.g. silicon oxide). Note that both an organic high molecular material and an inorganic material may be used as the commonly-known gate insulating material.

—Semiconductor Layer 104—

The semiconductor layer 104 is formed from an organic semiconductor material or an inorganic semiconductor material. Specifically, oligomers of low molecular materials (acene derivatives, porphyrin, phthalocyanine derivatives, etc.) which are suitable for application, high molecular materials (thiophenes, fluorenes, etc.) or the like may be used as the organic semiconductor material. Also, oxide semiconductors or the like may be used as the inorganic semiconductor material.

—SD Electrodes 105 and 106—

The SD electrodes 105 and 106 are made of one of molybdenum, tungsten, molybdenum-tungsten, vanadium, and ruthenium.

A surface of a part of the SD electrode 106, which is in contact with the organic layer 111, is oxidized. The oxidized surface (hereinafter also referred to as "metal oxide layer") 106a is made of at least one selected from the group consisting of molybdenum oxide, tungsten oxide, molybdenum-tungsten oxide, vanadium oxide, and ruthenium oxide.

—Interlayer Insulating Film 107—

The passivation film 108 is made of an insulating material such as polyimide resin or silicone resin.

The planarizing film 109 is made of an insulating material such as polyimide resin or acrylic resin.

—Organic Layer 111—

The organic layer 111 is made of a first organic layer 112 and a second organic layer 113 that are layered in the stated order.

The first organic layer 112 may include an azatriphenylene derivative. Content of the azatriphenylene derivative may be in the range of 50 having 30 wt % to 100 wt % inclusive, for example.

The azatriphenylene derivative is a compound represented by the following general formula.

General formula

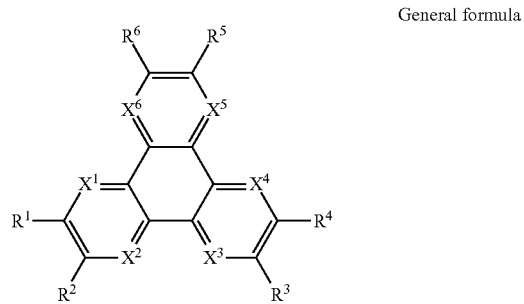

In the general formula shown above, R1 to R6 are each independently a substituent selected from hydrogen, halogen, a hydroxyl group, an amino group, an arylamino group, a substituted or unsubstituted carbonyl group having 20 or less carbon atoms, a substituted or unsubstituted carbonyl ester group having 20 or less carbon atoms, a substituted or unsubstituted alkyl group having 20 or less carbon atoms, a substituted or unsubstituted alkenyl group having 20 or less carbon atoms, a substituted or unsubstituted alkoxyl group having 20 or less carbon atoms, a substituted or unsubstituted aryl group having 30 or less carbon atoms, a substituted or unsubstituted heterocyclic group having 30 or less carbon atoms, a nitrile group, a cyano group, a nitro group, and a silyl group. Any adjacent substituents from among R1 to R6 are connectable to form a ring. X1 to X6 are each independently a carbon atom or a nitrogen (N) atom.

As shown by the partially enlarged view of the first organic layer 112 in FIG. 1, the azatriphenylene derivative is preferably hexaazatriphenylene-carbonitrile (HAT-CN).

The second organic layer 113 may include an amine-based compound. Content of the amine-based compound may be in the range of 50 wt % to 100 wt % inclusive, for example.

The amine-based compound is at least one selected from the group consisting of N,N'-diphenyl-N,N'-bis(1-naphthyl) benzidine (NPB), a triphenylamine derivative (TPD, β-NPD, MeO-TPD, TAPC), a phenylamine tetramer (TPTE), a star-burst-triphenylamine derivative (m-MTDADA, NATA, 1-TNATA, 2-TNATA), a spiro-triphenylamine derivative (Spiro-TPD, Spiro-NPD, Spiro-TAD), rubrene, pentacene, copper phthalocyanine (CuPc), titanium oxide phthalocyanine (TiOPc), and α-sexithiophene (α-6T).

As shown by the partially enlarged view of the second organic layer 113 in FIG. 1, the amine-based compound is preferably NPB.

A difference between the LUMO energy level of the first organic layer 112 and the HOMO energy level of the second organic layer 113 is preferably 1.5 eV or less, and more preferably 1.0 eV or less.

—Anode 114—

The anode 114 is made of at least one selected from the group consisting of aluminum, silver, chromium, nickel, and an alloy of any of these metals.

Note that a commonly-known transparent conductive film may be provided on a surface of the anode 114. A material used to form the transparent conductive film may be indium tin oxide (ITO) or indium zinc oxide (IZO).

—Bank 115—

The bank 115 is formed from an organic material such as resin, and has insulating properties. Examples of such organic material include acrylic resin, polyimide resin, and novolac phenolic resin. The bank 115 preferably has organic solvent resistance. Furthermore, since the bank 115 undergoes processes such as etching, baking, etc. when formed, it is preferable that the bank 115 is formed from a highly resistant material that will not change excessively in shape or quality during such processes.

—Organic Light-Emitting Layer 116—

The organic light-emitting layer 116 is preferably formed, for example, from a high molecular material such as polyfluorene, polyphenylene vinylene, polyacetylene, polyphenylene, polyparaphenylene ethylene, poly-3-hexylthiophene, or a derivative of any of these materials or, alternatively, from a fluorescent material recited in Japanese Patent Application Publication No. H5-163488, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone deriverative, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc.

—Cathode 117—

The cathode 117 is, for example, formed from a metal such as aluminum, silver, an alloy of neodymium and aluminum, an alloy of gold and aluminum, or an alloy of magnesium and silver, or a solid solution such as ITO, IZO, or the like. Alternatively, the cathode 117 is formed by a multilayer film.

—Sealing Film 118—

The sealing film 118 inhibits the organic light-emitting layer 116 from being exposed to moisture, air, etc., and is formed from a material such as silicon oxide (SiO), silicon nitride (SiN), silicon oxynitride (SiON), silicon carbide (SiC), silicon oxycarbide (SiOC), aluminum nitride (AlN), and aluminum oxide ($Al_2O_3$).

—Experiment—

—Experiment Overview—

Five Kelvin patterns were formed in order to evaluate the contact characteristics between the SD electrode and the anode. Then, each of the five Kelvin patterns was evaluated with use of a semiconductor parameter analyzer. Specifically, in a first experiment, the relationship between voltage and current density was evaluated for each of the following structures: structure 1 where an organic layer is not interposed between the SD electrode and the anode; structure 2 where an organic layer is interposed between the SD electrode and the anode, the organic layer being formed by layering a first organic layer and a second organic layer; structure 3 where a mixture layer 1 is interposed between the SD electrode and the anode, the mixture layer 1 being formed from the mixture of the materials of the first and the second organic layers; and structure 4 where a mixture layer 2 is interposed between the SD electrode and the anode, the mixture layer 2 being formed from the same materials as the mixture layer 1 but at a different mixture ratio therefrom. In a second experiment, the relationship between electric field intensity and current density was evaluated for each of the structure 2 and a structure where only the first organic layer is interposed between the SD electrode and the anode (hereinafter "structure 5").

—Device for Experiment—

As a Kelvin pattern for the structure 1, the SD electrode and the anode were layered on a glass substrate. The material used to form the SD electrode was Mo, and the thickness of the SD electrode was set to 75 nm. The anode was formed to have a two-layer structure, in which a lower layer was formed from an alloy of aluminum, cobalt, and lanthanum (ACL) and an upper layer was formed from IZO. Also, the thickness of the ACL was set to 200 nm, and the thickness of the IZO was set to 16 nm. Note that in practice, since a surface of the Mo oxidizes in the atmosphere, it is considered that the oxide of each of the Mo and the ACL exists at an interface between the Mo and the ACL.

Figure 2:
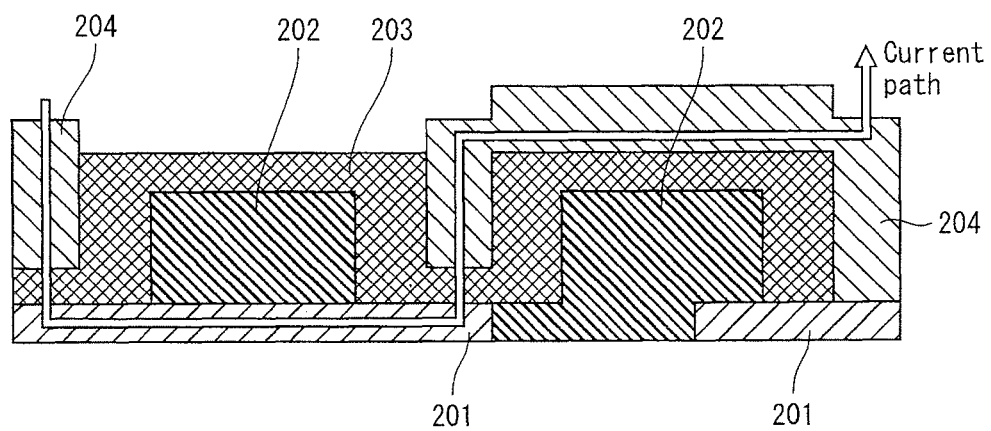
FIG. 2 is a cross-sectional view that schematically shows a Kelvin pattern.

FIG. 2 is a partial cross-sectional view that schematically shows a Kelvin pattern of each of the structures 2, 3, 4, and 5. The arrow in FIG. 2 indicates a current path in the Kelvin pattern. As shown in FIG. 2, the Kelvin pattern is formed with an SD electrode 201, an interlayer insulating film 202, an organic layer 203, and an anode 204 that are layered on a glass substrate (not shown). The structures 2 to 5 have the same structure except for the organic layer 203. The material used to form the SD electrode 201 was Mo, and the thickness of the SD electrode 201 was 75 nm. Note that patterning of the SD electrode 201 was performed with, as a resist material, TFR (product representative of photoresist for TFT array: manufactured by Tokyo Ohka Kogyo Co., Ltd.) which is a positive photoresist material. The thickness of the SD electrode 201 was set to 1.0 µm. The material used to form the interlayer insulating film 202 was acrylic resin. The thickness of the interlayer insulating film 202 was set to 2.5 µm. The anode 204 was formed to have a two-layer structure, in which a lower layer was formed from ACL and an upper layer was formed from IZO. Also, the thickness of the ACL was set to 200 nm, and the thickness of the IZO was set to 16 nm. Note that patterning of the anode 204 was performed with use of TFR as a resist material. The thickness of the anode 204 was set to 1.0 µm. The organic layer 203 differs among the structures 2 to 5. In the structure 2, the organic layer 203 was formed to have a two-layer structure, in which a lower layer was formed from HAT-CN and an upper layer was formed from NPB. Also, the thickness of the HAT-CN was set to 10 nm, and the thickness of the NPB was set to 30 nm. In the structures 3 and 4, the organic layer 203 was formed from a mixture layer (i.e., single-layer structure) formed from a mixture of HAT-CN and NPB. The thickness of the organic layer 203 was set to 40 nm. In the structure 3, the mixture layer was formed from a mixture of NPB and HAT-CN at a volume ratio of 9:1. In the structure 4, the mixture layer was formed from a mixture of NPB and HAT-CN at a volume ratio of 6:4. In the structure 5, the organic layer 203 was a single layer formed from HAT-CN, and the thickness thereof was set to 10 nm.

—Experiment Result—

Figure 3:
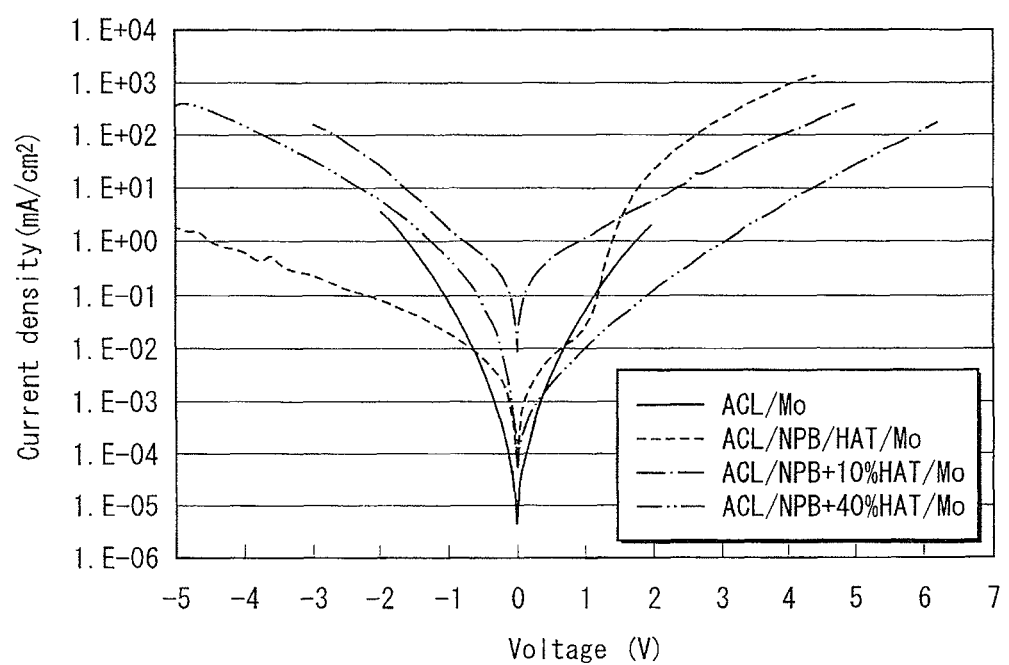
FIG. 3 shows a relationship between voltage and current density.

FIG. 3 shows the relationship between voltage and current density. The horizontal axis represents voltage (V), and the vertical axis represents current density (mA/cm$^2$). Also, in the graph of FIG. 3, the solid line represents the structure 1 (ACL/Mo); the dashed line represents the structure 2 (ACL/NPB/HAT-CN/Mo); the one-dot chain line represents the structure 3 (ACL/NPB+10% HAT-CN/Mo); and two-dot chain line represents the structure 4 (ACL/NPB+40% HAT-CN/Mo).

First, the focus is placed on the current density when a forward bias is applied. When the structure 1 is compared to the structure 2, the current density of the structure 2 is lower than that of the structure 1 in the range of approximately 0.6 V to approximately 1.2 V, but is higher than that of the structure 1 in the other ranges. Accordingly, as an overall evaluation, the current density of the structure 2 is higher than that of the structure 1 when a forward bias is applied. When the structure 1 is compared to the structure 3, the current density of the structure 3 is higher than that of the structure 1 at any point in the voltage range. Meanwhile, when the structure 1 is compared to the structure 4, the current density of the structure 4 is higher than the structure 1 in the range of 0 V to approximately 0.4 V, but is lower than the structure 1 when the voltage is higher than approximately 0.4 V. Accordingly, as an overall evaluation, the current density of the structure 4 is lower than that of the structure 1 when a forward bias is applied. When the structure 2 is compared to the structure 3, the current density of the structure 3 is higher than the structure 2 in the range of 0 V to approximately 1.5 V. However, the current density of the structure 2 is higher than the structure 3 when the voltage is higher than approximately 1.5 V. Generally speaking, an organic EL device is driven at a voltage of 1.5 V or greater. Therefore, it can be said that the structure 2 has the highest conductivity when a forward bias is applied.

Also, from the comparison between the structures 3 and 4, it is understood that although the structures 3 and 4 are similar in that a mixture layer is interposed between the ACL and the Mo, the current density decreases as the concentration of the HAT-CN in the mixture layer increases.

Next, the focus is placed on the current density when a reverse bias is applied. In this case, the current densities of the structures 3 and 4 are higher than that of the structure 1 at any point in the voltage range. Meanwhile, the current density of the structure 2 is higher than that of the structure 1 in the range of 0 V to approximately −0.5 V, but is lower than that of the structure 1 after the voltage reaches −0.5 V. Generally speaking, a reverse bias is applied at a voltage of approximately −0.5 V or less. Therefore, it can be said that the structure 2 is the best of all the structures 1 to 4.

To summarize the above comparisons, the structure 2 has the highest current density of all the structures 1 to 4 when a forward bias is applied, and has the lowest current density of all the structures 1 to 4 when a reverse bias is applied. This means that the structure 2 has diode characteristics. With the structure 2, it is possible to improve conductivity at a contact portion at which the SD electrode makes contact with the anode when a forward bias is applied, and to suppress a leak current when a reverse bias is applied.

In the structure 3, the current density is higher than that of the structure 1 when a forward bias is applied; however, the current density is also higher than that of the structure 1 when a reverse bias is applied. This means that the structure 3 does not have diode characteristics, which causes an increase in a leak current when a reverse bias is applied.

In the structure 4, the current density is lower than that of the structure 1 when a forward bias is applied, whereas the current density is higher than that of the structure 1 when a reverse bias is applied. This results in not only a decrease in conductivity when a forward bias is applied but also an increase in a leak current when a reverse bias is applied.

Figure 4:
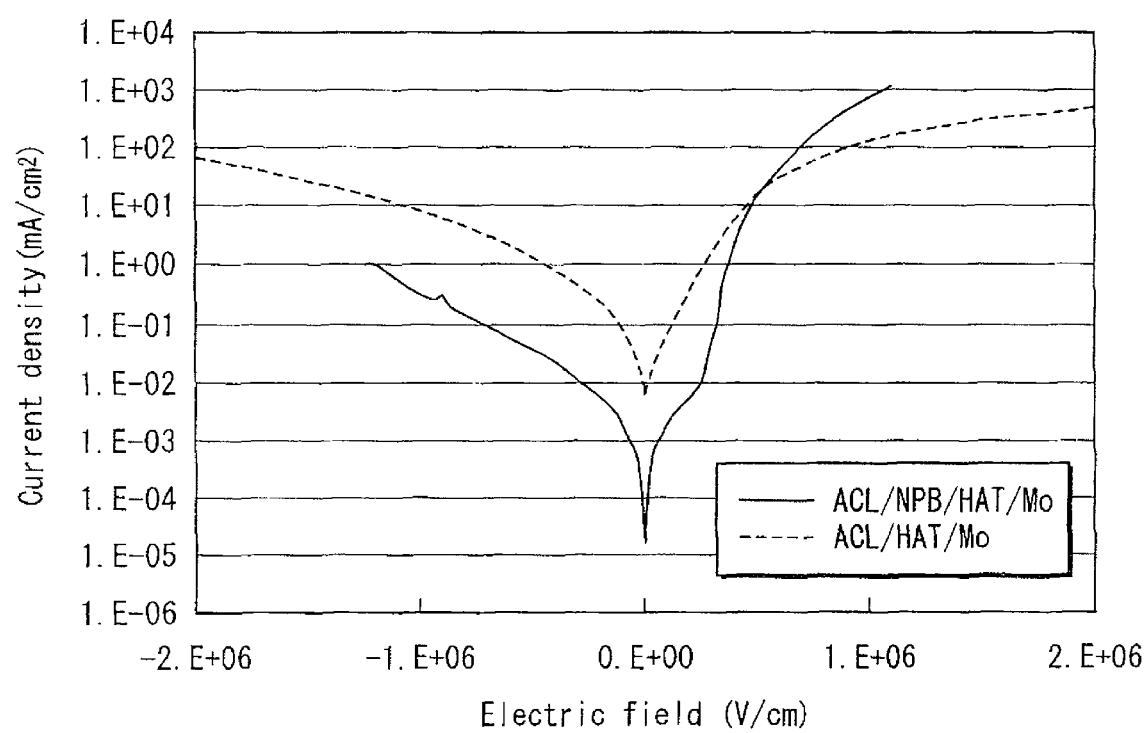
FIG. 4 shows a relationship between electric field and current density.

FIG. 4 shows a relationship between electric field and current density. The horizontal axis represents electric field (V/cm), and the vertical axis represents current density (mA/ cm²). Also, in the graph of FIG. 4, the solid line represents the structure 2 (ACL/NPB/HAT-CN/Mo); and the dashed line represents the structure 5 (ACL/HAT-CN/Mo). Note that the following evaluation was conducted by using electric field intensity instead of voltage, since the thickness of the organic layer in the structure 2 is different from that of the organic layer in the structure 5.

First, the focus is placed on the current density when a forward bias is applied. In this case, the current density of the structure 2 is lower than that of the structure 5 in the range of 0.E+00 to approximately 0.5E+06, but is higher than that of the structure 5 in the range approximately 0.5E+06 or greater.

Next, the focus is placed on the current density when a reverse bias is applied. In this case, the current density of the structure 5 is higher than that of the structure 2 at any point in the electric field range.

To summarize the above comparison, a current flows even in the single-layer structure with HAT-CN (i.e., structure 5) since the HAT-CN layer has oxidation resistance. However, as compared to the structure 2, the current density in the structure 5 is low when a forward bias is applied (in the range of approximately 0.5E+06 or greater), and the current density in the structure 5 is high when a reverse bias is applied. Therefore, it can be said that in the structure 5, the effectiveness of suppressing a leak current when a reverse bias is applied is lower than that in the structure 2.

—Conductivity Improvement Mechanism—

The following describes a mechanism of how conductivity is improved when a multilayer of HAT-CN and NPB is interposed between MoOx and Al.

Figure 5A:
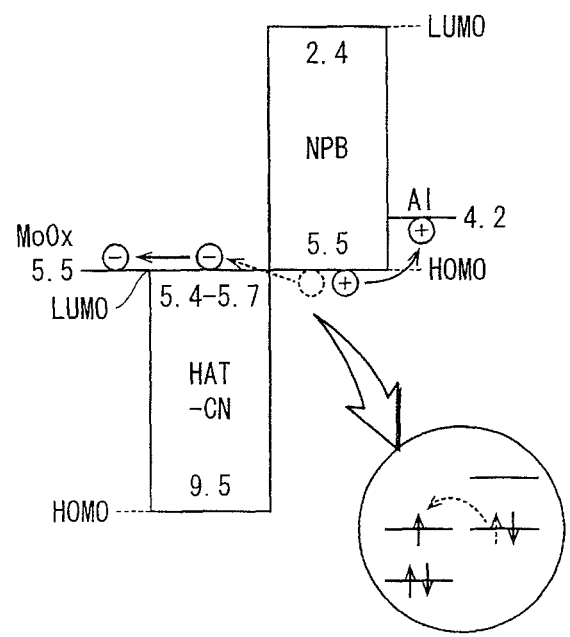
FIG. 5A schematically shows a movement of electric charge when a forward bias is applied, and FIG. 5B schematically shows a movement of electric charge when a reverse bias is applied.
Figure 5B:
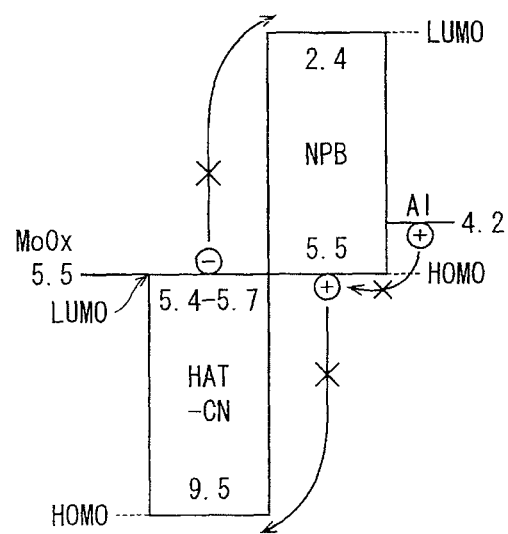

FIG. 5A schematically shows a movement of electric charge when a forward bias is applied. FIG. 5B schematically shows a movement of electric charge when a reverse bias is applied. In FIGS. 5A and 5B, the horizontal axis represents distance, and the vertical axis represents energy. Also, the work function of MoOx is 5.5 eV, and the work function of Al is 4.2 eV. The LUMO (lowest unoccupied molecular orbital) energy level of HAT-CN is in the range of 5.4 eV to 5.7 eV inclusive, and the HOMO (highest occupied molecular orbital) energy level thereof is 9.5 eV. The LUMO energy level of NPB is 2.4 eV, and the HOMO energy level thereof is 5.5 eV. Here, the value of the HOMO energy level of NPB is the same as, or very close to the value of the LUMO energy level of HAT-CN. Therefore, as shown in FIG. 5A, an electron of the HOMO of NPB is considered to move to the LUMO of HAT-CN even without application of voltage. In other words, NPB and HAT-CN are considered to function as charge generation layers. Accordingly, the amount of charge supplied to the anode is increased by the amount of charge generated at the NPB and the HAT-CN, thus improving conductivity.

On the other hand, as shown in FIG. 5B, when a reverse bias is applied, the energy gap of the NPB becomes a barrier to the movement of an electron to the Al and, similarly, the energy gap of the HAT-CN becomes a barrier to the movement of the positive hole to the MoOx. This suppresses the movement of charge.

—Effect—

The organic EL device 100 according to the present embodiment comprises: an organic EL element; the SD electrode 106; and the organic layer 111. The organic EL element includes the anode 114, the organic light-emitting layer 116 that is an organic EL layer, and the cathode 117. The SD electrode 106 constitutes a wiring layer for supplying power to the anode 114, and is located to face the anode with a gap therebetween. The organic layer 111 is interposed between the anode 114 and the SD electrode 106 so as to be in contact the anode 114 and the SD electrode 106. The organic layer 111 includes the first organic layer 112 and the second organic layer 113 that are formed on the SD electrode 106 in the stated order. The first organic layer 112 includes an azatriphenylene derivative. The second organic layer 113 includes an amine-based compound.

According to the organic EL device 100 of the present embodiment, the organic layer 111 is interposed between the anode 114 and the SD electrode 106 so as to be in contact with the anode 114 and the SD electrode 106. In other words, the anode 114 and the SD electrode 106 are not directly in contact with each other. Also, the organic layer 111 has oxidation resistance. Accordingly, even when a surface of the SD electrode 106 oxidizes to form the metal oxide layer 106a, oxidation of the anode 114 is prevented since, as described above, the metal oxide layer 106a does not make direct contact with the anode 114, and the organic layer 111 having oxidation resistance is interposed between the SD electrode 106 and the anode 114.

Also, the organic layer 111 is formed by layering the first organic layer 112 including an azatriphenylene derivative and the second organic layer 113 including an amine-based compound. As described above, the first organic layer and the second organic layer are considered to function as the charge generation layers. In other words, charge is generated at the interface between the first organic layer and the second organic layer. This increases the amount of current supplied to the anode 114, thus improving conductivity.

In addition, the portion at which the SD electrode 106 electrically makes contact with the anode 114 via the organic layer 111 has diode characteristics, which makes it possible to suppress a leak current when a reverse bias is applied.

—Manufacturing Method of Organic EL Device—

Figure 6A:
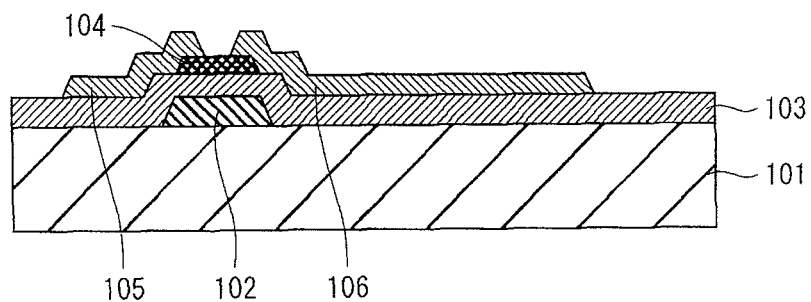
FIGS. 6A to 6C show an example of steps in a manufacturing process of the organic EL device 100.
Figure 6B:
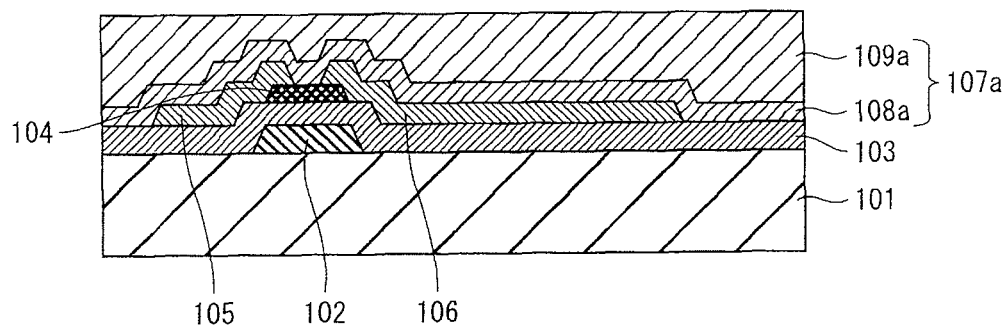
Figure 6C:
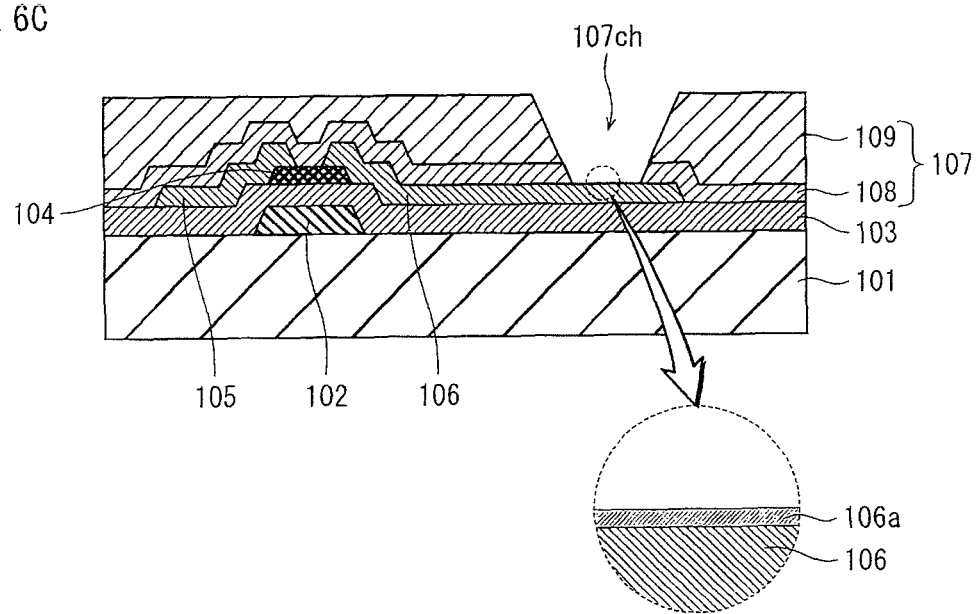

The following shows an example of a manufacturing process of the organic EL device 100. FIGS. 6 and 7 show an example of the manufacturing process of the organic EL device 100. Note that FIGS. 6 and 7 schematically show a part of the organic EL device 100.

First, a wiring layer formation step is performed. This step is for forming a wiring layer from metal. Specifically, the gate electrode 102 is formed on the substrate 101. Then, the gate insulating film 103 is formed to cover the gate electrode 102. Next, the semiconductor layer 104 is formed on a portion of the gate insulating film 103, which is located above the gate electrode 102. After the semiconductor layer 104 is formed, an SD electrode material layer is formed to cover the semiconductor layer 104. Subsequently, a resist layer is formed on the SD electrode material layer. After a mask having an opening of a predetermined shape is layered on the resist layer, the resist layer is exposed to light through the mask. Then, an unnecessary part of the resist layer is washed off with use of a developing solution such as a TMAH (tetra methyl ammonium hydroxide) solution. In this way, patterning of the resist layer is completed. After that, the SD electrode material layer is wet-etched with use of a wet etchant, and the resist layer is removed with use of, for example, an organic remover. As a result, the SD electrodes 105 and 106, which have a gap therebetween and partially extend over the semiconductor layer 104, are formed. FIG. 6A shows a stage of the manufacturing process after the above step is completed.

Next, an insulating material layer formation step is performed. This step is for forming an insulating material layer 107a on the wiring layer. Specifically, the insulating material layer 107a is formed to cover the SD electrodes 105 and 106, as shown in FIG. 6B. The insulating material layer 107a is composed of a passivation material layer 108a and a planarizing material layer 109a.

Next, an exposure step is performed. This step is for exposing a part of the wiring layer to an atmosphere including oxygen by removing a part of the insulating material layer 107a. The exposure step at least includes: a substep of forming the contact hole 107ch in the insulating material layer 107a so as to expose a part of the wiring layer; and a substep of forming the interlayer insulating film 107 by heating the insulating material layer 107a in a state where the part of the wiring layer is exposed. Specifically, a mask having an opening of a predetermined shape is layered on the insulating material layer 107a. Next, the insulating material layer 107a is exposed to light through the mask. Then, an unnecessary part of the insulating material layer 107a is washed off with use of a developing solution (wet process). In this way, the contact hole 107ch is formed, and the part of the SD electrode 106 is exposed to the atmosphere. Subsequently, a baking process is performed in a state where the part of the SD electrode 106 is exposed. Through the baking process, the interlayer insulating film 107 is formed. FIG. 6C shows a stage of the manufacturing process after the above step is completed. Note that since the baking process is performed in a state where the part of the SD electrode 106 is exposed, the surface 106a, which is a surface of the exposed portion of the SD electrode 106, oxidizes, as shown in the enlarged part of FIG. 6C.

Figure 7A:
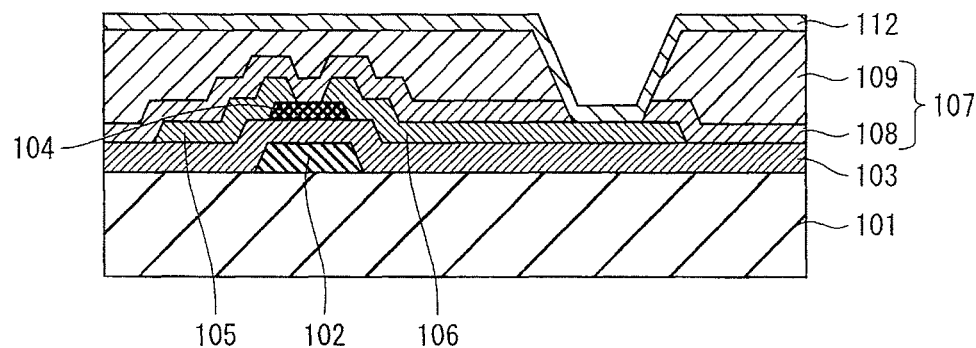
FIGS. 7A to 7C show an example of steps succeeding the steps shown in FIGS. 6A to 6C, in the manufacturing process of the organic EL device 100.
Figure 7B:
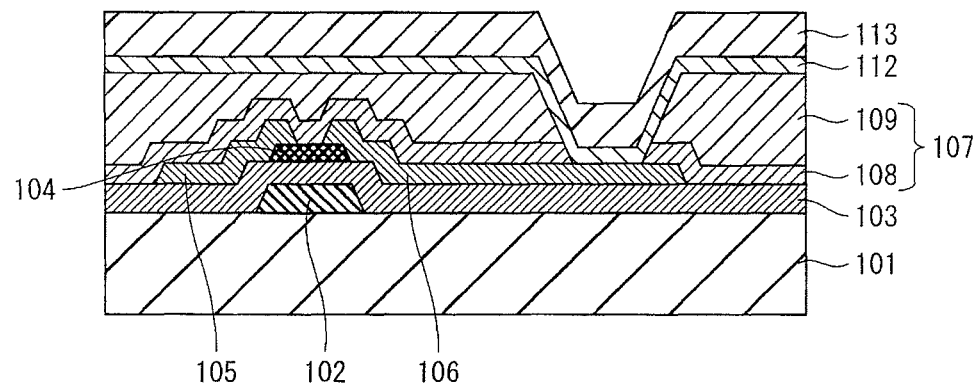

Next, as shown in FIG. 7A, a first organic layer formation step is performed. This step is for forming the first organic layer 112 which includes an azatriphenylene derivative, on the interlayer insulating film 107 and the exposed portion (i.e., surface 106a) of the SD electrode 106. The first organic layer 112 is formed by, for example, a vapor deposition method.

Figure 7C:
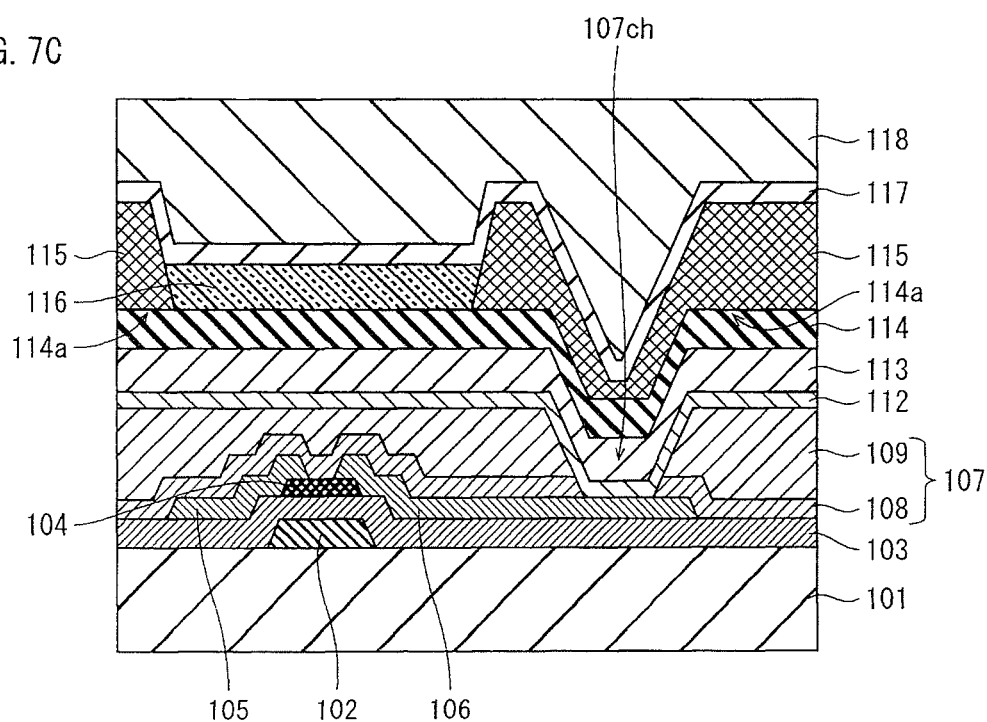
Figure 8:
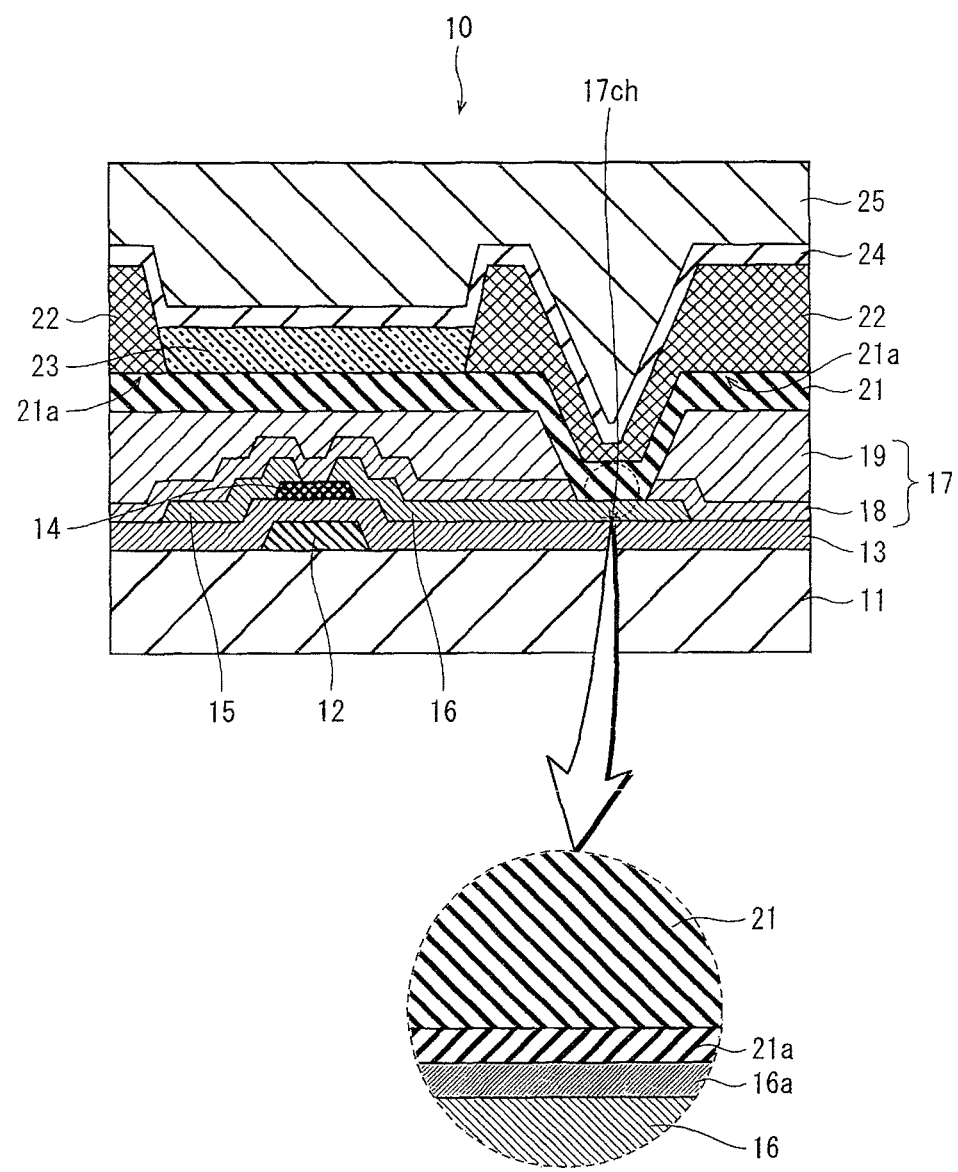
FIG. 8 is a partial cross-sectional view that schematically shows a main part of an organic EL device 10.

Next, as shown in FIG. 7C, a second organic layer formation step is performed. This step is for forming the second organic layer 113 which includes an amine-based compound, on the first organic layer 112. The second organic layer 113 is formed by, for example, a vapor deposition method.

Next, an organic EL element formation step is performed. This step is for forming an organic EL element by sequentially forming, on the second organic layer 113, the anode 114, the organic light-emitting layer 116, and the cathode 117. Specifically, the anode 114 is formed on the second organic layer 113. After the anode 114 is formed, the bank 115 is formed on the edge 114a of the anode 114 and on a portion of the anode 114 that corresponds to the contact hole 107ch. Then, the organic light-emitting layer 116 is layered on a portion of the anode 114, which is defined by the bank 115. Subsequently, the cathode 117 is formed on the organic light-emitting layer 116 and the bank 115. Finally, the sealing film 118 is formed on the cathode 117. After the above step is completed, a structure as shown in FIG. 7C is obtained.

Although an organic EL device according to the present invention has been described based on the above embodiment, the present invention is not limited to such. For example, the following modifications are possible.

(1) According to the above embodiment, the first organic layer includes an azatriphenylene derivative. However, it is not limited to such. Instead of the azatriphenylene derivative, it is possible to use a mixture of organic materials having a LUMO energy level of 3.4 eV or greater. Examples of such organic materials include CuPc (3.5 eV) and C60 (4.5 eV).

(2) According to the above embodiment, the second organic layer includes an amine-based compound. However, it is not limited to such. Instead of the amine-based compound, it is possible to use a mixture of organic materials having a HOMO energy level of 7.5 eV or less. Examples of such organic materials include a quinolinol complex (Alq3, BAlq, Liq, etc), phenanthroline derivative (BCP, BPhen, etc), phosphorus oxide derivative (POPy2, etc), oxadiazole derivative (PBD, etc), oxadiazole dimer (OXD-7, etc), starburst oxadiazole (TPOB, etc), spiro-oxadiazole derivative, triazole derivative (TAZ, etc), triazine derivative (TRZ, DPT, MPT, etc), silole derivative (PyPySPyPy, etc), dimesitylboron derivative (BMB, etc), triarylboron derivative (TPhB, etc), carbazole derivative (MCP, CBP, TCTA, etc), triphenylsilyl derivative (UGH2, UGH3, etc), iridium complex (Ir(ppy)3, Ir(ppy)2(acac), FIrPic, Fir6, Ir(piq)3, Ir(btp)2(acac), etc), rubrene, coumarin derivative (Coumarin6, C545T, etc), quinacridone derivative (DMQA, etc), pyran derivative (DCJTB, etc), and europium complex (Eu(dbm)3(phen), etc).

(3) The organic layer 111 does not always need to be formed on an entire surface of the interlayer insulating film 107, and may be formed at least on a contact portion at which the anode 114 makes contact with the and the SD electrode 106.

INDUSTRIAL APPLICABILITY

The present invention is applicable to organic EL devices.

REFERENCE SIGNS LIST 101 substrate
102 gate electrode
103 gate insulating film
104 semiconductor layer
105,106 SD electrode
107 interlayer insulating film
108 passivation film
109 planarizing film
111 organic layer
112 first organic layer
113 second organic layer
114 anode
115 bank
116 organic light-emitting layer
117 cathode
118 sealing film

The invention claimed is:

1. An organic EL device, comprising:
an organic EL element including an anode, an organic EL layer, and a cathode;
a wiring layer that supplies power to the anode; and
an organic layer interposed between the anode and the wiring layer, wherein
the organic layer includes a first organic layer including an azatriphenylene derivative and a second organic layer including at least one of an amine-based compound, rubrene, pentacene, and alpha-sexithiophene, the first organic layer being layered on the wiring layer, and the second organic layer being layered on the first organic layer, and
the wiring layer includes a metal layer and a metal oxide layer, the metal oxide layer including an oxide of a material of the metal layer and being in contact with the organic layer.

2. The organic EL device of claim 1, wherein the azatriphenylene derivative is a compound represented by the following general formula:

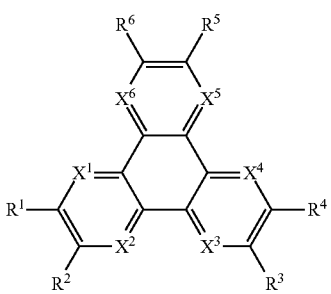

wherein
R1 to R6 are each independently a substituent selected from hydrogen, halogen, a hydroxyl group, an amino group, an arylamino group, a substituted or unsubstituted carbonyl group having 20 or less carbon atoms, a substituted or unsubstituted carbonyl ester group having 20 or less carbon atoms, a substituted or unsubstituted alkyl group having 20 or less carbon atoms, a substituted or unsubstituted alkenyl group having 20 or less carbon atoms, a substituted or unsubstituted alkoxyl group having 20 or less carbon atoms, a substituted or unsubstituted aryl group having 30 or less carbon atoms, a substituted or unsubstituted heterocyclic group having 30 or less carbon atoms, a nitrile group, a cyano group, a nitro group, and a silyl group,
any adjacent substituents from among R1 to R6 are connectable to form a ring, and
X1 to X6 are each independently a carbon atom or a nitrogen atom.

3. The organic EL device of claim 1, wherein
the amine-based compound includes at least one of a triphenylamine derivative, a phenylamine tetramer, a starburst-triphenylamine derivative, and a spiro-triphenylamine derivative.

4. The organic EL device of claim 1, wherein
the metal oxide layer is made of at least one of molybdenum oxide, tungsten oxide, molybdenum-tungsten oxide, vanadium oxide, and ruthenium oxide.

5. The organic EL device of claim 1, wherein
the anode is made of at least one of aluminum, silver, chromium, nickel, and an alloy of any of aluminum, silver, chromium, and nickel.

6. The organic EL device of claim 1, wherein
the wiring layer is one of a source electrode and a drain electrode of a thin-film transistor.

7. A manufacturing method of an organic EL device comprising the steps of:
forming a wiring layer from metal;
forming an insulating material layer on the wiring layer;
exposing a part of the wiring layer to an atmosphere including oxygen by removing a part of the insulating material layer;
forming a first organic layer on the part of the wiring layer by a vapor deposition method, the first organic layer including an azatriphenylene derivative;
forming a second organic layer on the first organic layer by the vapor deposition method, the second organic layer including an amine-based compound; and
forming an organic EL element by sequentially forming, on the second organic layer, an anode, an organic EL layer, and a cathode.

8. The manufacturing method of claim 7, wherein
in the exposing step, a metal surface of the part of the wiring layer is oxidized.

9. The manufacturing method of claim 7, wherein
the exposing step at least includes:
a substep of forming a contact hole in the insulating material layer so as to expose the part of the wiring layer; and
a substep of forming an insulating layer by heating the insulating material layer in a state where the part of the wiring layer is exposed.

10. The organic EL device of claim 1, wherein
the second organic layer includes at least one of N,N'-diphenyl-N,N'-bis(1-naphthyl)benzidine (NPB), N,N,N',N'-tetraphenylbenzidine (TPD), 4,4'-bis[N-(2-naphthyl)-N-phenylamino]biphenyl (β-NPD), N,N,N',N'-tetrakis(4-Methoxyphenyl)benzidine (MeO-TPD), 1,1-bis[4-(di-4-tolylamino)phenyl]cyclohexane (TAPC), phenylamine tetramer (TPTE), 4,4',4"-tris(N-3-methylphenyl-N-phenylamino)triphenylamine (m-MTDADA), N-acetyl-L-tryptophanamide (NATA), 4,4',4'-tris(N-(1-naphthyl)-N-phenylamino)-triphenylamine (1-TNATA), 4,4',4"-tris(N-(2-naphthyl)-N-phenylamino)-triphenylamine (2-TNATA), N,N-Bis(3-methylphenyl)-N,N-diphenyl-9,9-spirobifluorene-2,7-diamine (Spiro-TPD), N,N'-diphenyl-N,N'-bis(1naphthyl)-9,9'-spirobifluorene-2,7-diamine (Spiro-NPD), 2,2',7,7'-Tetrakis(diphenylamino)-9,9'-spirobifluorene (Spiro-TAD), copper phthalocyanine, and titanium oxide phthalocyanine.

11. The organic EL device of claim 1, wherein
the organic EL layer is interposed between the anode and the cathode; and
the wiring layer is opposite the organic EL layer with the anode therebetween.

* * * * *